US012745016B2

(12) United States Patent
Lee

(10) Patent No.: US 12,745,016 B2
(45) Date of Patent: Sep. 22, 2026

(54) IMAGE SENSING DEVICE INCLUDING TEST PATTERN

(71) Applicant: SK hynix Inc., Icheon-si (KR)

(72) Inventor: Gon Ji Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 57 days.

(21) Appl. No.: 18/899,634

(22) Filed: Sep. 27, 2024

(65) Prior Publication Data

US 2025/0119661 A1 Apr. 10, 2025

(30) Foreign Application Priority Data

Oct. 6, 2023 (KR) ........................ 10-2023-0133368

(51) Int. Cl.
*H04N 25/69* (2023.01)
*H04N 25/78* (2023.01)
*H10F 39/00* (2025.01)

(52) U.S. Cl.
CPC ............. *H04N 25/69* (2023.01); *H04N 25/78* (2023.01); *H10F 39/8037* (2025.01)

(58) Field of Classification Search
CPC .. H10F 39/8037; H10F 39/811; H10F 39/809; H10F 39/803; H04N 25/69; H04N 25/79; H04N 25/78; H04N 25/76; H04N 17/002; G01R 31/2884; H01L 22/32
USPC .......................................................... 348/308
See application file for complete search history.

(56) References Cited

U.S. PATENT DOCUMENTS 8,988,575 B2 * 3/2015 Mabuchi ............... H10F 39/811
348/308
9,865,641 B2 * 1/2018 Takemoto ............... H10F 39/18
10,032,822 B2 * 7/2018 Takahashi ............. H10F 39/812
11,257,407 B2 * 2/2022 Pappas ................. G09G 3/2014
11,735,617 B2 * 8/2023 Chen ..................... H10F 39/024
257/432
11,832,011 B2 * 11/2023 Asakura .................. H10F 39/18
(Continued)

FOREIGN PATENT DOCUMENTS

CN 113937117 A 1/2022
KR 20030043259 A 6/2003

OTHER PUBLICATIONS

Office Action for Taiwanese Appl. No. 113137696, mailed on Jul. 11, 2025, 9 pages with English translation.
(Continued)

*Primary Examiner* — Pritham D Prabhakher

(74) *Attorney, Agent, or Firm* — Ashurst Perkins Coie US LLP

(57) ABSTRACT

An image sensing device includes a pixel array including pixel units that include first pixel transistors located in different rows of the pixel array; first upper signal lines respectively connected to the first pixel transistors; a first test line commonly connected to the first upper signal lines; a first test pad connected to the first test line and configured to provide a first test signal to the first test line; and a first test transistor connected to the first test line and the first test pad and configured to enable or disable a test operation by selectively providing the first test signal to the first test line. During the test operation, the first test signal may be provided to the first pixel transistors located in different rows of the pixel array through the first test transistor, the first test line, and the first upper signal lines.

20 Claims, 6 Drawing Sheets

(56) References Cited

U.S. PATENT DOCUMENTS

| | | | | |
|---|---|---|---|---|
| 12,289,965 | B2 * | 4/2025 | Zhao | H10K 59/131 |
| 12,329,001 | B2 * | 6/2025 | Jin | H10K 71/70 |
| 2007/0146002 | A1 * | 6/2007 | Hsieh | G09G 3/006 324/760.02 |
| 2009/0140127 | A1 | 6/2009 | Lee et al. | |
| 2012/0249458 | A1 * | 10/2012 | Okazaki | G06F 3/0446 345/173 |
| 2014/0104471 | A1 | 4/2014 | Mabuchi et al. | |
| 2016/0141328 | A1 | 5/2016 | Takemoto | |
| 2017/0033144 | A1 | 2/2017 | Takahashi | |
| 2020/0052033 | A1 * | 2/2020 | Iguchi | H10D 86/423 |
| 2021/0242252 | A1 | 8/2021 | Chen et al. | |
| 2022/0046201 | A1 | 2/2022 | Asakura | |
| 2022/0328598 | A1 * | 10/2022 | Zhao | H10K 59/131 |
| 2023/0207575 | A1 * | 6/2023 | Yoo | H10D 86/441 |
| 2023/0215771 | A1 | 7/2023 | Liao et al. | |
| 2023/0316966 | A1 * | 10/2023 | Cha | G06V 40/1318 |
| 2024/0407207 | A1 * | 12/2024 | Jin | G09G 3/006 |

OTHER PUBLICATIONS

Extended European Search Report for EP Appl. No. 24204798.3, mailed on Jan. 29, 2025, 11 pages.

* cited by examiner

IMAGE SENSING DEVICE INCLUDING TEST PATTERN

CROSS-REFERENCE TO RELATED APPLICATION

This patent document claims the priority and benefits of Korean patent application No. 10-2023-0133368, filed on Oct. 6, 2023, the disclosure of which is incorporated by reference in its entirety as part of the disclosure of this patent document.

TECHNICAL FIELD

The technology and implementations disclosed in this patent document generally relate to an image sensing device, and more particularly to an image sensing device including a test pattern for testing defects of signal lines.

BACKGROUND

An image sensing device is used in electronic devices to convert optical images into electrical signals. Image sensing devices may be broadly classified into a CCD (Charge Coupled Device) image sensing device and a CMOS (Complementary Metal Oxide Semiconductor) image sensing device.

The CCD image sensing device may be driven more easily than the CCD image sensing device. In addition, the CMOS image sensing device is compatible with CMOS fabrication technology, resulting in reduction in production costs. In recent times, the CMOS image sensing devices have been intensively researched and rapidly come into widespread use.

SUMMARY

In accordance with an embodiment of the disclosed technology, an image sensing device may include: a pixel array including pixel units configured to generate photocharge in response to incident light, the pixel units including a plurality of first pixel transistors located in different rows of the pixel array; a plurality of first upper signal lines respectively connected to the plurality of first pixel transistors; a first test line, separated from and commonly connected to, the plurality of first upper signal lines; a first test pad connected to the first test line and configured to provide a first test signal to the first test line; and a first test transistor connected to the first test line and the first test pad and configured to enable or disable a test operation by selectively providing the first test signal to the first test line. During the test operation, the first test signal may be provided to the plurality of first pixel transistors located in different rows of the pixel array through the first test transistor, the first test line, and the plurality of first upper signal lines.

In some implementations, each of the plurality of first pixel transistors may be any one of a reset transistor, a selection transistor, a transfer transistor, and a gain conversion transistor.

In some implementations, the image sensing device may further include: a plurality of first lower signal lines respectively connected to the plurality of first upper signal lines. The plurality of first pixel transistors, the plurality of first upper signal lines, and the first test line may be disposed in a first substrate, and the plurality of first lower signal lines may be disposed in a second substrate located below the first substrate.

In some implementations, the pixel array may further include a plurality of second pixel transistors disposed in different rows from one another.

In some implementations, the pixel array may further include: a plurality of second upper signal lines respectively connected to the plurality of second pixel transistors; a second test line separate from and commonly connected to the plurality of second upper signal lines; a second test pad connected to the second test line and configured to provide a second test signal to the second test line; and a second test transistor connected to the second test line and the second test pad.

In some implementations, the first test transistor and the second test transistor may be activated at the same time.

In some implementations, the first test transistor and the second test transistor may be activated at different times from each other.

In some implementations, the pixel units further include an additional first pixel transistor located in a same row of the pixel array as one of the plurality of first pixel transistors, and one of the plurality of first upper signal lines is connected to the one of the plurality of first pixel transistors and the additional first pixel transistor.

In some implementations, the image sensing device may further include: a plurality of first lower signal lines respectively connected to the plurality of first upper signal lines, wherein a first control signal for controlling a first pixel transistor is provided to a plurality of first pixel transistors located in an arbitrary row of the pixel array through an arbitrary first lower signal line and an arbitrary first upper signal line that is located in the arbitrary row of the pixel array and connected to an arbitrary first lower signal line.

In some implementations, the first test line may be located below the first upper signal line, and may be located in the same substrate as the first upper signal line.

In some implementations, the pixel array includes a first substrate and a second substrate that are disposed to overlap each other.

In accordance with another embodiment of the disclosed technology, an image sensing device may include: a pixel array located in a first substrate layer and configured to receive incident light and generate photocharge in response to the incident light; a plurality of first pixel transistors located in an arbitrary row included in the pixel array; a first upper signal line connected to the plurality of first pixel transistors and located in the first substrate layer; a first test line connected to the first upper signal line and located in the first substrate layer; a first lower signal line connected to the first upper signal line and located in a second substrate layer below the first substrate layer; and a first test transistor connected to the first lower signal line and a first test pad. The first test line, the first test transistor and the first test pad are provided to test the plurality of first pixel transistors, and during a sensing operation, a first control signal for the first pixel transistor is provided to the plurality of first pixel transistors through the first lower signal line and the first upper signal line, and during a test operation, a first test signal provided through the first test pad is provided to the plurality of first pixel transistors without passing through the first lower signal line.

In some other implementations, the image sensing device further includes an additional first pixel transistor located in a different row from the arbitrary row and connected to a different first upper signal line from the first upper signal line.

In some other implementations, the different first upper signal line is connected to the first test line and the first test signal is provided to the additional first pixel transistor.

In some other implementations, a second control signal different from the first control signal is provided to the additional first pixel transistor.

In some other implementations, each of the plurality of first pixel transistors is a reset transistor, a selection transistor, a transfer transistor, or a gain conversion transistor.

In some other implementations, the first test line is located below the first upper signal line, and is located in a same substrate as the first upper signal line.

In some other implementations, the image sensing device further includes a second pixel transistor located in the arbitrary row and connected to a different first upper signal line from the first upper signal line.

In some other implementations, a second test signal different from the first test signal is provided to the second pixel transistor.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
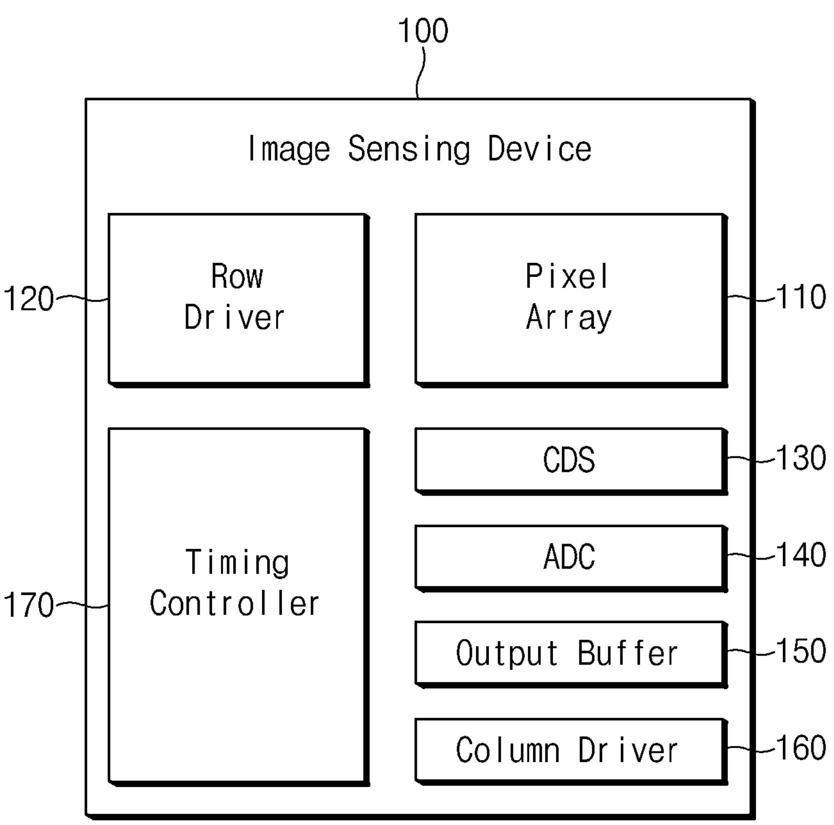
FIG. 1 is a block diagram illustrating an example of an image sensing device based on some implementations of the disclosed technology.

When the fabrication processes of the CMOS image sensing device are completed, a probe test can be performed to determine whether the signal lines included in the CMOS image sensing device are defective. The location of a defective signal line can be confirmed through the probe test, but it may be difficult to confirm the location of the defective signal line when the probe test for signal lines cannot be performed due to a layout structure of a substrate. This patent application discloses designs of CMOS image sensing devices to enable a test pattern for easily testing and confirming the location of a physical defect in the signal lines.

This patent document provides implementations and examples of an image sensing device including a test pattern for testing defects of signal lines, that may be used in configurations to substantially address one or more technical or engineering issues and to mitigate limitations or disadvantages encountered in some other image sensing device designs. Some implementations of the disclosed technology relate to a test pad for directly applying power to a signal line to easily confirm the location of a defect in signal lines. In recognition of the issues above, the image sensing device may include a test pad for directly providing a test signal to signal lines disposed in a substrate to be tested, so that the image sensing device can easily confirm the location of a defect in signal lines using the test pad. The image sensing device may include a separate test line in addition to a signal line to which a drive signal of a pixel transistor is applied, and may thus provide a test signal to a signal line to be tested for defect inspection without passing through the signal line to which the drive signal is applied.

Various embodiments of the disclosed technology relate to an image sensing device capable of easily confirming the location of a defect in signal lines.

Various embodiments of the disclosed technology relate to a test pad for directly applying power to a signal line to easily confirm the location of a defect in signal lines.

It is to be understood that both the foregoing general description and the following detailed description of the disclosed technology are illustrative and explanatory and are intended to provide further explanation of the disclosure as claimed.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein.

Hereinafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

In the following description, a detailed description of related known configurations or functions incorporated herein will be omitted to avoid obscuring the subject matter.

The terminology used herein is for the purpose of describing particular embodiments only and is not intended to be limiting of the disclosed technology. As used herein, the singular forms are intended to include the plural forms as well, unless the context clearly indicates otherwise. It will be further understood that the terms "comprises", "includes", "including", and/or "comprising," when used in this specification, specify the presence of stated constituent elements, steps, operations, and/or components, but do not preclude the presence or addition of one or more other constituent elements, steps, operations, and/or components thereof. The term "and/or" may include a combination of a plurality of items or any one of a plurality of items.

FIG. 1 is a block diagram illustrating an image sensing device 100 based on some implementations of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160, and a timing controller 170. The components of the image sensing device 100 illustrated in FIG. 1 are discussed by way of example only, and this patent document encompasses numerous other changes, substitutions, variations, alterations, and modifications.

The pixel array 110 may include a plurality of unit imaging pixels arranged in rows and columns. In one example, the plurality of unit imaging pixels can be arranged in a two dimensional pixel array including rows and columns.

The plurality of unit imaging pixels may convert optical signals into electrical signals, each unit imaging pixel may include a plurality of photoelectric conversion elements, and the photoelectric conversion elements may be commonly connected to at least specific transistors.

The pixel array 110 may receive driving signals, including a row selection signal, a pixel reset signal and a transmission signal, from the row driver 120. Upon receiving the driving signal, corresponding imaging pixels in the pixel array 110 may be activated to perform the operations corresponding to the row selection signal, the pixel reset signal, and the transmission signal.

The row driver 120 may activate the pixel array 110 to perform certain operations on the imaging pixels in the corresponding row based on commands and control signals provided by controller circuitry such as the timing controller 170.

In some implementations, the row driver 120 may select one or more imaging pixels arranged in one or more rows of the pixel array 110. The row driver 120 may generate a row selection signal to select one or more rows among the plurality of rows.

The row driver 120 may sequentially enable the pixel reset signal for resetting imaging pixels corresponding to at least one selected row, and the transmission signal for the pixels corresponding to the at least one selected row. Thus, a reference signal and an image signal, which are analog signals generated by each of the imaging pixels of the selected row, may be sequentially transferred to the CDS 130.

The reference signal may be an electrical signal that is provided to the CDS 130 when a sensing node of an imaging pixel (e.g., floating diffusion node) is reset, and the image signal may be an electrical signal that is provided to the CDS 130 when photocharges generated by the imaging pixel are accumulated in the sensing node. The reference signal indicating unique reset noise of each pixel and the image signal indicating the intensity of incident light may be generically called a pixel signal as necessary.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer for performing counting until a voltage of the ramp signal matches the analog pixel signal. In some embodiments of the disclosed technology, the ADC 140 may convert the correlate double sampling signal generated by the CDS 130 for each of the columns into a digital signal, and output the digital signal.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the image data provided to the output buffer 150 from the ADC 140 may be temporarily stored in the output buffer 150 based on control signals of the timing controller 170. The output buffer 150 may provide an interface to compensate for data rate differences or transmission rate differences between the image sensing device 100 and other devices.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data as an output signal from the selected column of the output buffer 150.

The timing controller 170 may control operations of the row driver 120, the ADC 140, the output buffer 150 and the column driver 160.

The timing controller 170 may provide the row driver 120, the column driver 160 and the output buffer 150 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

Figure 2:
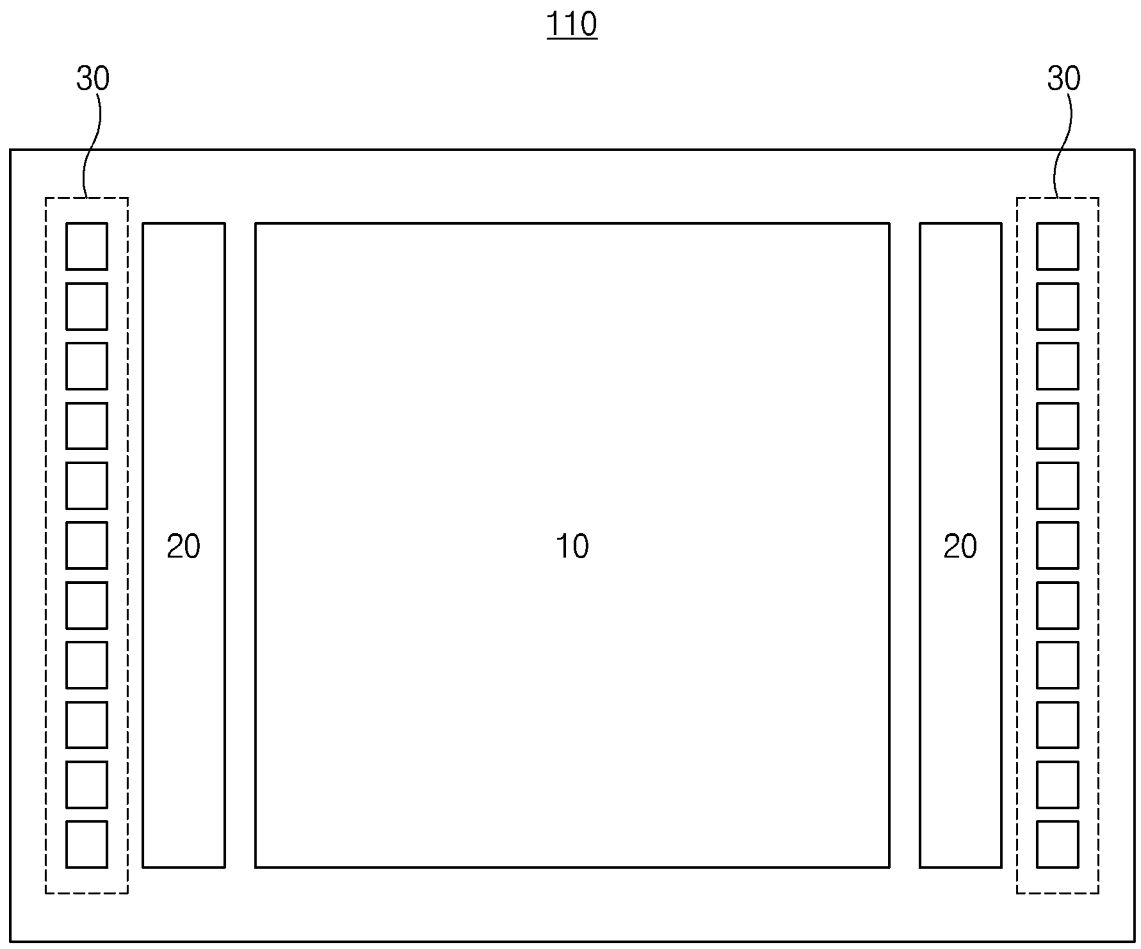
FIG. 2 is a diagram illustrating an example of a portion of a pixel array based on some implementations of the disclosed technology.

FIG. 2 is a diagram illustrating an example of a portion of the pixel array 110 based on some implementations of the disclosed technology.

FIG. 2 illustrates a unit pixel region 10 included in the pixel array 110, at least one bonding region 20 located near the unit pixel region 10, and at least one pad region 30 located near the unit pixel region 10. For example, at least one bonding region 20 is located on a side of the unit pixel region 10. For example, at least one pad region 30 is located on a side of the bonding region such that the bonding region 20 is located between the unit pixel region 10 and the pad region 30. As further discussed later, the bonding region 20 and the pad region may be located to surround the unit pixel region 10.

Referring to FIG. 2, the pixel array 110 may include a structure in which a plurality of substrate layers is stacked. For example, the plurality of substrate layers may include a semiconductor layer, and an interlayer insulation layer formed over the semiconductor layer.

For example, the semiconductor layer may be or include a monocrystalline silicon substrate. The semiconductor layer may be a P-type or N-type bulk substrate, may be a substrate formed by growing a P-type or N-type epitaxial layer on the P-type bulk substrate, or may be a substrate formed by growing a P-type or N-type epitaxial layer on the N-type bulk substrate.

A photoelectric conversion element for converting incident light into photocharges or a source/drain region of a pixel transistor may be disposed within the semiconductor layer.

The interlayer insulation layer may be or include a layer containing an insulative material such as silicon oxide or silicon nitride, and may be used as a region in which signal lines including metal interconnects are provided or a gate of a pixel transistor is formed.

Metal interconnects disposed in the interlayer insulation layer may include metals such as copper (Cu), tungsten (W), or aluminum (Al). A detailed vertical stacking structure of the pixel array 110 will be described in detail with reference to FIG. 4.

The unit pixel region 10 may be or include a region in which a plurality of photoelectric conversion elements, a plurality of pixel transistors, and a floating diffusion region are disposed. The unit pixel may be a minimum unit of a pixel layout repeatedly arranged within the unit pixel region 10.

The photoelectric conversion elements may be regions that generate photocharge in response to incident light received by the photoelectric conversion elements, respectively, and may be formed by doping an impurity region in the semiconductor layer. Each of the photoelectric conversion elements may be implemented as a photodiode, a phototransistor, a photogate, a pinned photodiode (PPD), or a combination thereof.

Pixel transistors may be transistors that process pixel signals corresponding to photoelectric conversion elements. By way of example, each pixel transistor may be any one of a transfer transistor, a selection transistor, a reset transistor, or a gain conversion transistor.

The bonding region 20 may refer to a region in which elements (e.g., signal lines, etc.) arranged in a plurality of layers of the pixel array 110 are electrically connected to each other.

The bonding region 20 may include an upper bonding metal layer provided in an upper layer (i.e., a first substrate layer), and a lower bonding metal layer provided in a lower layer (i.e., a second substrate layer). Signal lines or others, which are included in each of the upper layer and the lower layer, may be electrically connected to each other according to a bonding method of the bonding metals. The bonding metal may include, for example, aluminum (Al), copper (Cu), or tungsten (W).

In addition, the bonding region 20 may include signal lines extending from the unit pixel region 10. Signal lines disposed in the first substrate layer and signal lines disposed in the second substrate layer may be connected to each other through the bonding metals.

The pad region 30 may refer to a region in which a plurality of input/output (I/O) pads (PADs) is arranged. The input/output (I/O) pad may be a means for providing an external signal to the pixel array 110, or a means for outputting a pixel signal to the outside.

External signals provided to the input/output (I/O) pad may be transmitted to a pixel transistor, etc. through signal lines provided in a plurality of layers and the bonding region 20. The external signal may be or include, for example, a control signal for each pixel transistor or a test signal to determine whether a defect occurs in the signal lines.

The control signal received through the input/output (I/O) pad may be transmitted to the pixel transistor through a lower signal line disposed in the lower layer (i.e., the second substrate layer) of the pixel array 110, the bonding region, and an upper signal line disposed in the upper layer (i.e., the first substrate layer).

In some implementations, an additional test pad may be provided in the pad region 30. The test pad may be a pad that receives a test signal from an external test device. The test signal may be provided to a signal line included in the pixel array 110 through the test pad and the test line.

Although the bonding region 20 and the pad region 30 of FIG. 2 are shown as being provided on the left and right sides of the unit pixel region 10 for convenience of description, the positions and shapes of the bonding region 20 and the pad region 30 are not limited to the embodiment of FIG. 2.

In an example, the bonding region 20 and the pad region 30 may be selectively located at upper, lower, left, and right sides of the unit pixel region 10. For example, the bonding region 20 and the pad region 30 may be arranged to surround the unit pixel region 10 according to the layout shape, or may be located in any one of upper, lower, left, and right sides of the unit pixel region 10.

The semiconductor device based on some implementations of the disclosed technology may include a test pad and a test line, so that the semiconductor device can perform a defect test on signal lines respectively connected to the pixel transistors of the pixel array 110.

More specifically, the test line may be provided in the upper layer (i.e., the first substrate layer) of the pixel array 110, and may be connected to upper signal lines disposed in the upper layer. Since the test signal can be provided to the upper signal lines through the test line, the semiconductor device can easily recognize whether a defect occurs in the upper signal lines without applying a control signal to the pixel transistor.

In some implementations, one test line may be commonly connected to upper signal lines connected to the same type of pixel transistors disposed in the pixel array 110.

The same type of pixel transistors may refer to transistors that perform the same function during a sensing operation of the image sensing device.

In addition, the semiconductor device includes the test line so that the test signal is provided to the upper signal lines without passing through the lower signal lines. As a result, the semiconductor device can figure out whether a defect occurs at the lower signal line or the upper signal line.

The image sensing device may identify (or specify) a row in which a defect occurs in the upper signal line within the pixel array 110 by providing a control signal to the pixel transistor. In addition, the image sensing device provides a test signal to the test line, so that the image sensing device can specific (or identify) a defective pixel transistor having a defective upper signal line from among a plurality of pixel transistors arranged in the row direction.

Figure 3:
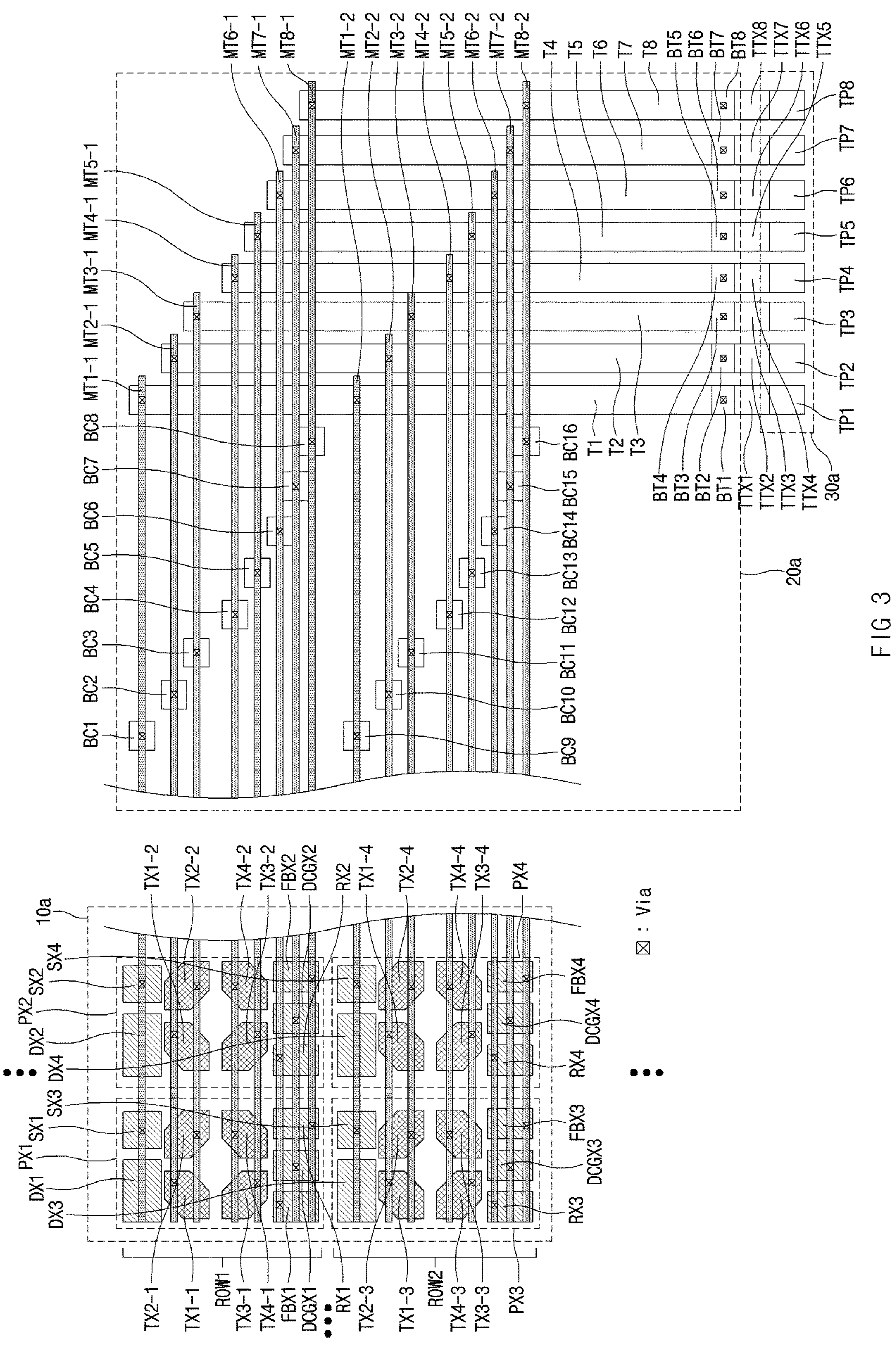
FIG. 3 is a diagram illustrating an example of a detailed structure of the pixel array based on some implementations of the disclosed technology.

FIG. 3 is a diagram illustrating an example of a detailed structure of the pixel array 110 based on some implementations of the disclosed technology.

In FIG. 3, a unit pixel region 10*a*, a bonding region 20*a*, and a pad region 30*a* are specifically illustrated in detail.

The unit pixel region 10*a* and the bonding region 20*a* shown in FIG. 3 may be arranged in one substrate layer (e.g., the first substrate layer). More specifically, constituent components included in the unit pixel region 10*a* and the bonding region 20*a* shown in FIG. 3 may be components included in the upper layer (i.e., the first substrate layer) from among the plurality of semiconductor layers included in the pixel array 110.

The components vertically connected to each other in FIG. 3 may be connected through vertical vias.

Referring to FIG. 3, the unit pixel region 10*a* may include a plurality of unit pixels (PX1, PX2, PX3, PX4).

The plurality of unit pixels (PX1, PX2, PX3, PX4) may be arranged in a matrix shape within the unit pixel region 10*a*.

Referring to FIG. 3, a first unit pixel (PX1) and a second unit pixel (PX2) may be arranged in a first row (ROW1) included in the unit pixel region 10*a*, and a third unit pixel (PX3) and a fourth unit pixel (PX4) may be arranged in a second row (ROW2) included in the unit pixel region 10*a*.

FIG. 3 illustrates only four unit pixels (PX1, PX2, PX3, PX4) and two rows (ROW1, ROW2) for convenience of description. The number of unit pixels and the number of rows, which are included in the unit pixel, can be modified in various manners. For example, the unit pixel region 10*a* may include unit pixels more than 4 and rows more than 2. In the example as shown in FIG. 3, the first set of the upper signal lines MT1-1 to MT8-1 and the second set of the upper signal lines MT1-2 to MT8-2 are provided. The first set of the upper signal lines MT1-1 to MT8-1 are included in the first row and the second set of the upper signal lines MT1-2 to MT8-2 are included in the second row.

Since the unit pixels (PX1, PX2, PX3, PX4) shown in FIG. 3 are substantially identical in terms of the structures, the structure of the unit pixel will hereinafter be described based on the structure of the first unit pixel (PX1), and as such redundant description thereof will herein be omitted for brevity.

The first unit pixel (PX1) may include a first drive transistor (DX1), a first selection transistor (SX1), a first reset transistor (RX1), a first gain conversion transistor (DCGX1), and four transfer transistors (TX1-1, TX2-1, TX3-1, TX4-1).

The first unit pixel (PX1) may include a first floating diffusion region (FD1) that receives photocharges from a photoelectric conversion element (not shown), and the first floating diffusion region (FD1) may be connected to a floating diffusion boosting signal line (MT8-1).

The first unit pixel (PX1) may further include a first capacitive element (CAP1) that is connected to a first floating diffusion region (FD1) through a first gain conversion transistor (DCGX1) to change the storage capacity of the first floating diffusion region (FD1).

The transfer transistors (TX1-1, TX2-1, TX3-1, TX4-1) may correspond to photoelectric conversion elements (not shown), respectively. In this case, the first unit pixel (PX1) may include four photoelectric conversion elements.

The four photoelectric conversion elements are example only and the number of photoelectric conversion elements included in the unit pixel can be variously modified. For example, instead of four photoelectric conversion elements, the unit pixel may include two photoelectric conversion elements or may include eight photoelectric conversion elements arranged in a (2×4) matrix. In an example, the unit pixel may include the same number of transfer transistors as the number of photoelectric conversion elements.

Each of the photoelectric conversion elements may generate photocharges corresponding to incident light. The generated photocharges may be transferred to the first floating diffusion region (FD1) through each transfer transistor (e.g., TX1-1).

The first drive transistor (DX1) may amplify a voltage change corresponding to photocharges transferred to the first floating diffusion region (FD1). A gate terminal of the first drive transistor (DX1) may be in contact with one end of the first floating diffusion region (FD1).

The first selection transistor (SX1) may determine whether to output a pixel signal corresponding to the amplified voltage. The first selection transistor (SX1) may be connected to one end of the first drive transistor (DX1).

The first reset transistor (RX1) may remove photocharges from the first unit pixel (PX1), and may reset the first unit pixel (PX1) to a pixel voltage.

The first gain conversion transistor (DCGX1) may be connected between the first floating diffusion region (FD1) and the first capacitive element (CAP1), and may adjust capacitance of the first floating diffusion region (FD1).

The first capacitive element (CAP1) is merely an example configuration, and may be omitted depending on the embodiment. In addition, a separate transistor (e.g., a blooming transistor, etc.) may be provided within the unit pixel instead of the first capacitive element (CAP1).

The eighth upper signal line (MT8-1) connected to the first floating diffusion region (FD1) and the second floating diffusion region (FD2) may be a signal line for providing a boosting voltage to the first floating diffusion region (FD1) and the second floating diffusion region (FD2). The description above has been provided mainly for the first unit pixel in the first row, the similar description applied to the second to fourth unit pixels in the pixel array. When the description above is applied to the unit pixel in the second row, the second set of the upper signal lines MT1-2 to MT8-2 can be connected to the components of the unit pixel in the second row.

The unit pixels (PX1, PX2, PX3, PX4) may be repeatedly arranged in row and column directions.

Pixel transistors, which are respectively included in the unit pixels located in one row and perform the same function during a sensing operation, may be commonly connected to any one of the upper signal lines (MT1-1~MT8-2).

For example, the selection transistors performing the same function during the sensing operation and located in a same row of a same pixel array are connected to a corresponding upper signal line. For example, the first selection transistor (SX1) included in the first unit pixel (PX1) and the second selection transistor (SX2) included in the second unit pixel (PX2) may be commonly connected to the first upper signal line (MT1-1).

For example, the transfer transistors performing the same function during the sensing operation and located in a same row of a same pixel array are connected to a corresponding upper signal line. For example, the first transfer transistor (TX1-1) included in the first unit pixel (PX1) belonging to the first row (ROW1) and the second transfer transistor (TX1-2) included in the second unit pixel (PX2) belonging to the first row (ROW1) may be commonly connected to the second upper signal line (MT2-1).

The first to eighth upper signal lines (MT1-1~MT8-1) arranged in the first row (ROW1) may be provided in the upper layer (i.e., the first substrate layer) from among the plurality of semiconductor layers included in the pixel array 110. The first to eighth upper signal lines (MT1-1~MT8-1) arranged in the first row (ROW1) may be signal lines through which control signals for the pixel transistors (e.g., SX1, RX1, TX1-1, TX2-1, TX3-1, TX4-1, DCGX1, etc.) are transmitted, or may be signal lines for transmitting a boosting voltage to the floating diffusion region (e.g., FD1, etc.).

The upper signal lines (MT1-1~MT8-2) may be disposed in an interlayer insulation layer provided in the first substrate, and may include metal such as copper (Cu), tungsten (W), or aluminum (Al).

The remaining pixel transistors other than the drive transistor (e.g., DX1) or the floating diffusion region may be connected to the upper signal lines (MT1-1~MT8-2).

The number of upper signal lines (MT1-1~MT8-1) included in one row (e.g., ROW1) may be determined based on the number of elements included in each unit pixel (e.g. PX1) (e.g., transistors or floating diffusion regions, etc.).

The control signal for the pixel transistors (e.g., SX1, SX2) received from the row driver (120 in FIG. 1) may be transmitted to the upper signal line (e.g., MT-1) through lower signal line (not shown) and a control bonding (e.g., BC1) that are included in the lower layer (i.e., the second substrate layer) from among the plurality of semiconductor layers included in the pixel array 110. The upper signal line (e.g., MT1-1) may transmit the received control signal to a connected pixel transistor (e.g., SX1, SX2).

Each of the control bondings (BC1~BC16) may be a bonding in which elements (e.g., upper signal lines and lower signal lines) disposed in each of a plurality of substrates included in the pixel array (110 in FIG. 1) are connected to each other.

Test lines (T1~T8) included in the bonding region 20*a* may be commonly connected to a plurality of upper signal lines (MT1-1~MT8-2).

For example, the first test line (T1) may be commonly connected to the first upper signal line (MT1-1) disposed in the first row (ROW1) and the first upper signal line (MT1-2) disposed in the second row (ROW2).

In the example, the first test line (T1) may be commonly connected to all first upper signal lines (e.g., MT1-1, MT1-2, etc.) connected to the selection transistors (SX1, SX2, SX3, SX4, etc.) included in the unit pixel region 10*a*.

In the example, the second test line (T2) may be commonly connected to all second upper signal lines (MT2-1, MT2-2, etc.) connected to all first transfer transistors (TX1-1, TX1-2, TX1-3, TX1-4, etc.) included in the unit pixel region 10*a*.

As the test line (e.g., T1) is commonly connected to the plurality of upper signal lines (e.g., MT1-1, MT1-2), the test signal received through the test line may be commonly connected to the upper signal lines (e.g., MT1-1, MT1-2).

As previously described, pixel transistors located in the same row may receive the same control signal. Therefore, when there is a defect in the upper signal line(s), a row in which an error has occurred may be identified (or specified) based on the pixel signal that is output for each row.

In addition, as the test signal is included in the unit pixel region 10*a* and is simultaneously transmitted to the plurality of upper signal lines (e.g., MT1-1, MT1-2) connected to the pixel transistors configured to perform the same function during the sensing operation, it is possible to easily identify (or specify) which one of the upper signal lines located in the same row has a defect.

The test lines (T1~T8) may be connected to different test pads (TP1~TP8). A test voltage may be provided to each of the test pads.

During the sensing operation, the upper signal lines (e.g., MT1-1, MT6-1) connected to pixel transistors (e.g., SX1, RX1, etc.) configured to perform different functions may receive different test signals.

Whether or not the test voltage is provided to each test pad may be determined depending on the ON/OFF states of test transistors (TTX1~TTX8).

In some implementations, the on/off states of the test transistors (TTX1~TTX8) may be determined by one test enable signal or may be determined by different test enable signals respectively applied to the test transistors (TTX1~TTX8).

The test lines (T1~T8) may be respectively connected to the test transistors (TTX1~TTX8) through a conductive line located in the second substrate layer through test bondings (BT1~BT8).

The test pad (P1~P8) and the test lines (T1~T8) may be short-circuited or opened depending on whether the test transistors (TTX1~TTX8) are turned on or off.

Since the test transistors (TTX1~TTX8) determine whether the test pads (P1~P8) and the test lines (T1~T8) are short-circuited or opened, the test transistors (TTX1~TTX8) may individually perform defect tests for different types of pixel transistors, and can prevent the test voltage from being applied to the pixel transistors during the sensing operation.

Figure 4:
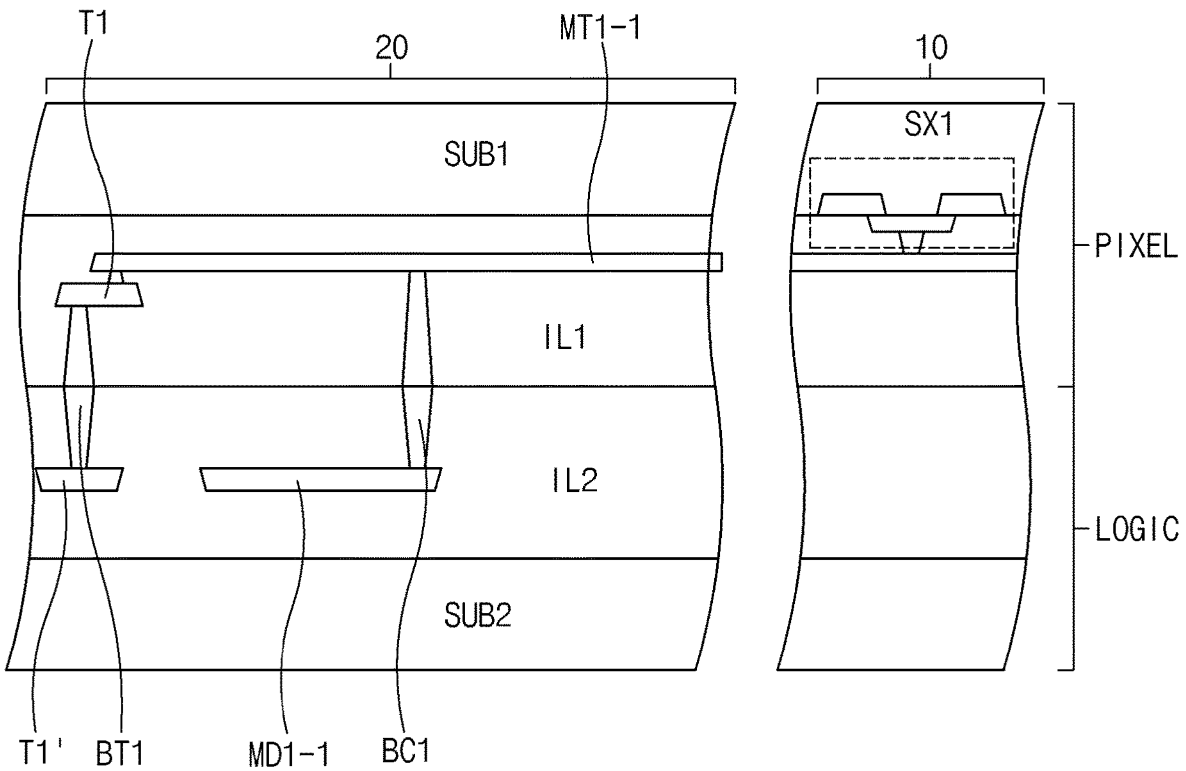
FIG. 4 is a cross-sectional view illustrating an example of the pixel array based on some implementations of the disclosed technology.

FIG. 4 is a cross-sectional view illustrating an example of the pixel array 110 based on some implementations of the disclosed technology.

A cross-sectional view of the pixel array 110 including a first substrate layer (PIXEL) and a second substrate layer (LOGIC) is illustrated in FIG. 4.

The first substrate layer (PIXEL) may be a layer containing a photoelectric conversion element, a pixel transistor, and the like, and may be referred to as a pixel layer. The second substrate layer (LOGIC) may be a region including peripheral circuits that are electrically connected to elements included in the first substrate layer (PIXEL), and may be referred to as a logic layer.

The first substrate layer (PIXEL) may include a first semiconductor layer (SUB1) and a first interlayer insulation layer (IL1).

The first semiconductor layer (SUB1) may be or include a monocrystalline silicon substrate. The first semiconductor layer (SUB1) may be or include a P-type or N-type bulk substrate, may be or include a substrate formed by growing a P-type or N-type epitaxial layer on the P-type bulk substrate, or may be or include a substrate formed by growing a P-type or N-type epitaxial layer on the N-type bulk substrate.

The first interlayer insulation layer (IL1) may be or include a layer containing an insulative material such as silicon oxide or silicon nitride.

In the example, the second substrate layer (LOGIC) may include a second semiconductor layer (SUB2) and a second interlayer insulation layer (IL2).

In the example, as similar to the first semiconductor layer (SUB1), the second semiconductor layer (SUB2) may be or include a P-type or N-type bulk substrate, may be or include a substrate formed by growing a P-type or N-type epitaxial layer on the P-type bulk substrate, or may be or include a substrate formed by growing a P-type or N-type epitaxial layer on the N-type bulk substrate.

The second interlayer insulation layer (IL2) may be or include a layer containing an insulative material such as silicon oxide or silicon nitride.

A pixel transistor (e.g., SX1) may be disposed in the first semiconductor layer (SUB1). More specifically, a source/drain region of the pixel transistor may be formed in the first semiconductor layer (SUB1).

The upper signal line (MT1-1) and the test line (T1) may be formed in the first interlayer insulation layer (IL1). As shown in FIG. 4, the test line (T1) may be disposed below the upper signal line (MT1-1).

The upper signal line (MT1-1) may be connected to a lower signal line (MD1-1) provided in the second substrate layer (LOGIC) through the control bonding (BC1). The lower signal line (MD1-1) may be connected to a pad for applying a control signal to the pixel transistor.

The test line (T1) may be connected to a lower test line (T1') provided in the second substrate layer (LOGIC) by a test bonding (BT1). The lower test line (T1') may be connected to the test pad through a test transistor.

Referring to FIG. 4, during the sensing operation of the image sensing device, a control signal may be transferred to a pixel transistor (e.g., SX1) through a lower signal line (e.g., MD1-11), a control bonding (e.g., BC1), and an upper signal line (e.g., MT1-1).

In addition, during the test operation of the image sensing device, the test signal may be transmitted to an upper signal line (e.g., MT1-1) through a lower test line (e.g., T1'), a test bonding (e.g., BT1), and a test line (e.g., T1).

Figure 5:
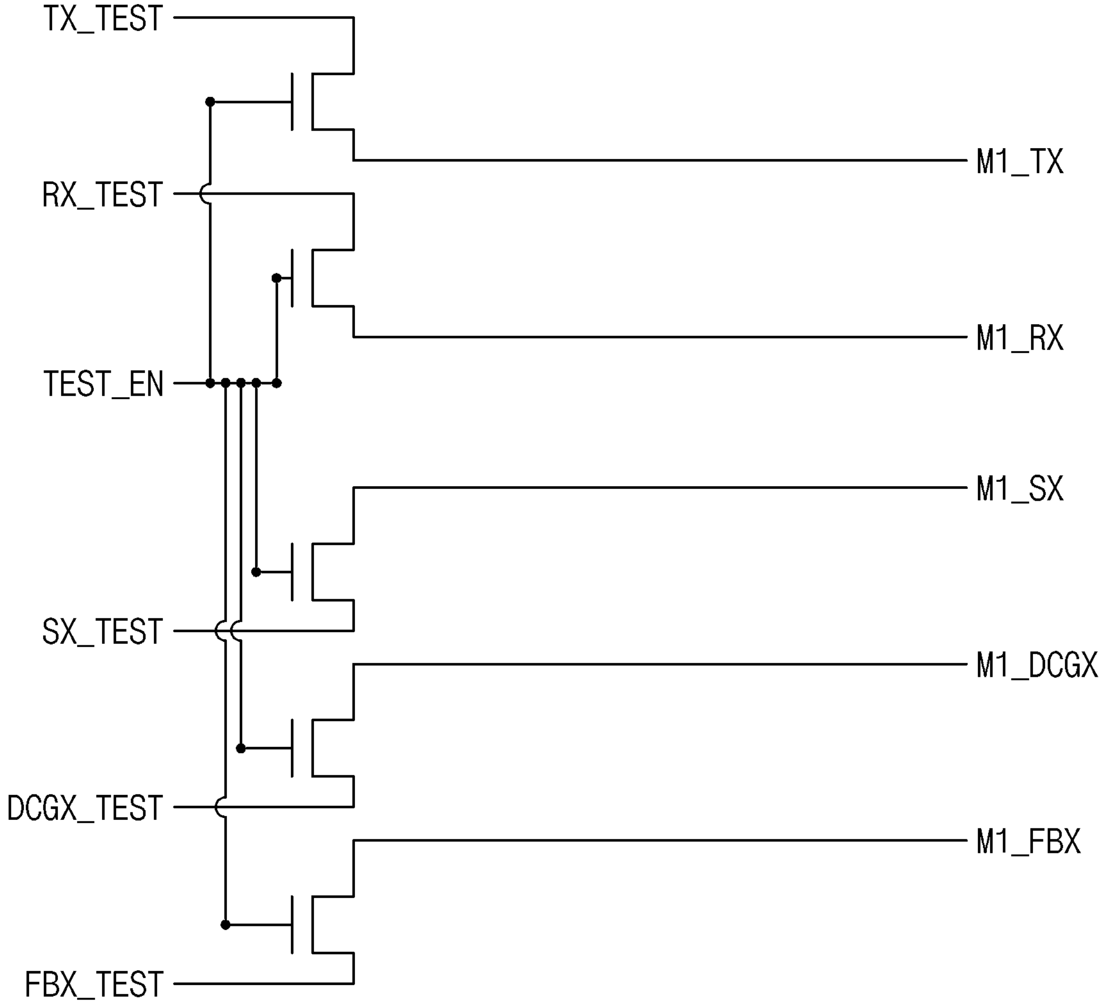
FIGS. 5 and 6 are diagrams illustrating examples of a method for operating test transistors based on some implementations of the disclosed technology.
Figure 6:
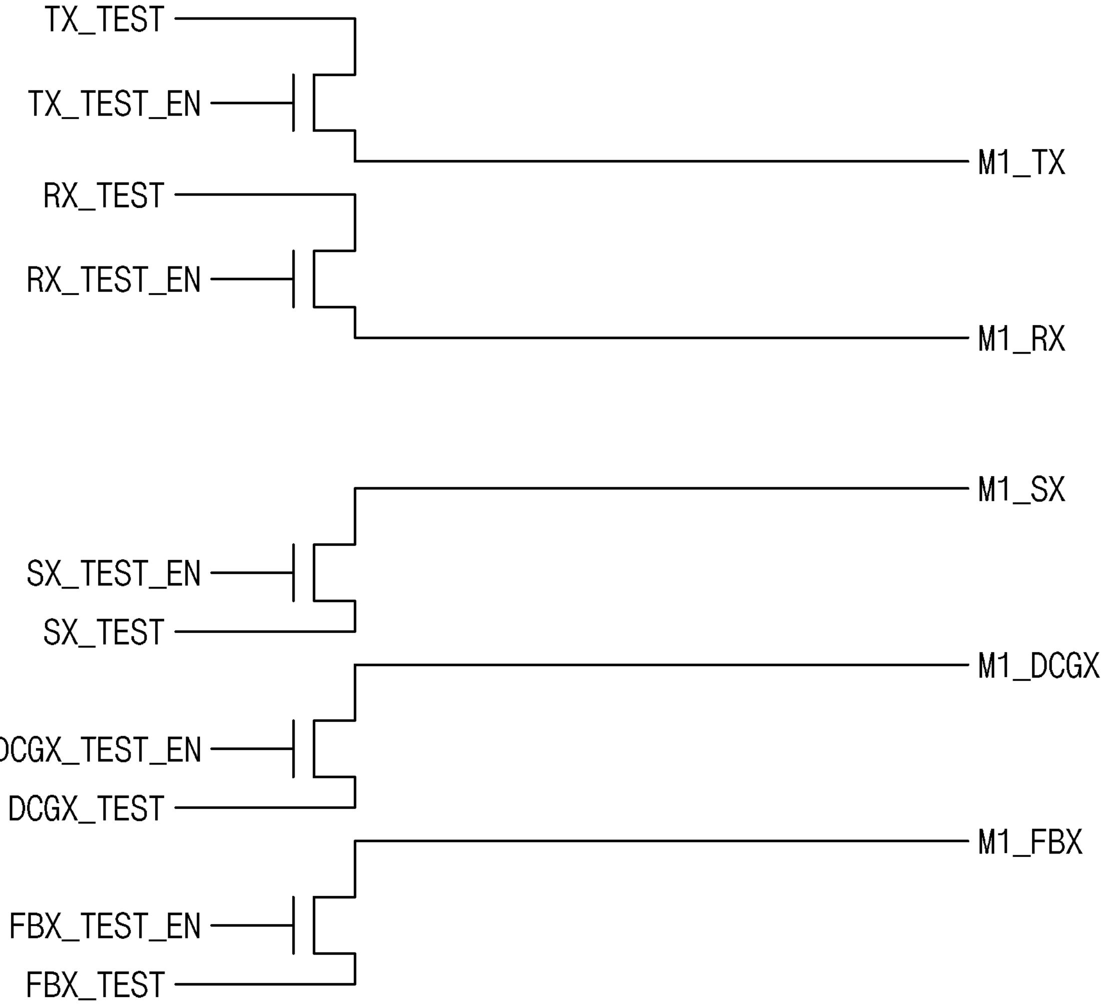

FIGS. 5 and 6 are diagrams illustrating examples of a method for operating the test transistors based on some implementations of the disclosed technology.

Referring to FIG. 5, information about whether to transmit test signals (TX1_TS, TX2_TS, TX3_TS, TX4_TS, SX_TS, RX_TS, DCGX_TS, FBX_TS) for the respective test pads to the test lines (T_TX1, T_TX2, T_TX3, T_TX4, T_SX, T_RX, T_DCGX, T_FBX) may be determined based on the ON/OFF states of the test transistors (TX1_TT, TX2_TT, TX3_TT, TX4_TT, SX_TT, RX_TT, DCGX_TT, FBX_TT).

The test transistors (TX1_TT, TX2_TT, TX3_TT, TX4_TT, SX_TT, RX_TT, DCGX_TT, FBX_TT) shown in FIG. 5 may respectively correspond to the test transistors (TTX1, TTX2, TTX3, TTX4, TTX5, TTX6, TTX7, TTX8) shown in FIG. 3.

In a situation where test enable signals (TEST_EN) respectively provided to different test transistors are the same signals as shown in FIG. 5, the test signals (TX1_TS, TX2_TS, TX3_TS, TX4_TS, SX_TS, RX_TS, DCGX_TS, FBX_TS) may be provided to the test lines (T_TX1, T_TX2, T_TX3, T_TX4, T_SX, T_RX, T_DCGX, T_FBX) only when the test enable signal is activated. Accordingly, during the remaining operation other than the test operation, the test signals can be prevented from being provided to the pixel transistors or the floating diffusion region.

The test lines (T_TX1, T_TX2, T_TX3, T_TX4, T_SX, T_RX, T_DCGX, T_FBX) shown in FIG. 5 may respectively correspond to the test lines (T1, T2, T3, T4, T5, T6, T7, T8) shown in FIG. 3.

For example, when the test enable signal (TEST_EN) is activated, the test transistor (FBX_TT) for the floating diffusion boosting signal may be activated, and the test signal (FBX_TS) for the floating diffusion boosting signal line may be provided to the floating diffusion region through the test line (T_FBX).

In comparison with the corresponding components of FIG. 3, when the test enable signal (TEST_EN) is activated, the eighth test transistor (corresponding to TTX8 and FBX_TT in FIG. 3) may be activated, and a test signal (corresponding to FBX_TS) provided through the eighth test pad (TP8 in FIG. 3) may be provided as a floating diffusion region through the eighth test line (corresponding to T8 and T_FBX in FIG. 3).

As shown in FIG. 6, different test enable signals (TX1_TEST_EN, TX2_TEST_EN, TX3_TEST_EN, TX4_TEST_EN, SX_TEST_EN, RX_TEST_EN, DCGX_TEST_EN, FBX_TEST_EN) may be provided to the test transistors (TX1_TT, TX2_TT, TX3_TT, TX4_TT, SX_TT, RX_TT, DCGX_TT, FBX_TT), respectively.

The test transistors (TX1_TT, TX2_TT, TX3_TT, TX4_TT, SX_TT, RX_TT, DCGX_TT, FBX_TT) of FIG. 6 may correspond to the test transistors (TTX1, TTX2, TTX3, TTX4, TTX5, TTX6, TTX7, TTX8) of FIG. 3, respectively.

For example, when the test enable signal (FBX_TEST_EN) for the floating diffusion boosting signal line is activated, the test transistor (FBX_TT) for the floating diffusion boosting signal line may be activated, and the test signal (FBX_TS) for the floating diffusion boosting signal line may be provided to the floating diffusion region through the test line (T_FBX).

As shown in FIG. 6, when test enable signals (TX1_TEST_EN, TX2_TEST_EN, TX3_TEST_EN, TX4_TEST_EN, SX_TEST_EN, RX_TEST_EN, DCGX_TEST_EN, FBX_TEST_EN) respectively provided to different test transistors (TX1_TT, TX2_TT, TX3_TT, TX4_TT, SX_TT, RX_TT, DCGX_TT, FBX_TT) are different from each other, the test signals (TX1_TS, TX2_TS, TX3_TS, TX4_TS, SX_TS, RX_TS, DCGX_TS, FBX_TS) may be respectively provided to the test lines (T_TX1, T_TX2, T_TX3, T_TX4, T_SX, T_RX, T_DCGX, T_FBX).

As is apparent from the above description, the image sensing device based on some implementations of the disclosed technology includes a test pad for directly providing a test signal to signal lines disposed in a substrate to be tested, so that the image sensing device can easily confirm the location of a defect in signal lines using the test pad.

The image sensing device based on some implementations of the disclosed technology includes a separate test line in addition to a signal line to which a drive signal of a pixel transistor is applied, and thus provides a test signal to a signal line to be tested for defect inspection without passing through the signal line to which the drive signal is applied.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein. In addition, claims that are not explicitly presented in the appended claims may be presented in combination as an embodiment or included as a new claim by a subsequent amendment after the application is filed.

Although a number of illustrative embodiments have been described, it t should be understood that modifications and/or enhancements to the disclosed embodiments and other embodiments can be devised based on what is described and/or illustrated in this patent document.

What is claimed is:

1. An image sensing device, comprising:

a pixel array including pixel units configured to generate photocharge in response to incident light, the pixel units including a plurality of first pixel transistors located in different rows of the pixel array;

a plurality of first upper signal lines respectively connected to the plurality of first pixel transistors;

a first test line, separated from and commonly connected to, the plurality of first upper signal lines;

vertical vias disposed between the first test line and at least one of the plurality of first upper signal lines, the vertical vias being in contact with both the first test line and the at least one of the plurality of first upper signal lines;

a first test pad connected to the first test line and configured to provide a first test signal to the first test line; and a first test transistor connected to the first test line and the first test pad and configured to enable or disable a test operation by selectively providing the first test signal to the first test line, wherein during the test operation, the first test signal is provided to the plurality of first pixel transistors located in different rows of the pixel array through the first test transistor, the first test line, the vertical vias and the plurality of first upper signal lines in sequence.

2. The image sensing device according to claim 1, wherein:

each of the plurality of first pixel transistors is a reset transistor, a selection transistor, a transfer transistor, or a gain conversion transistor.

3. The image sensing device according to claim 1, further comprising:

a plurality of first lower signal lines respectively connected to the plurality of first upper signal lines, wherein the plurality of first pixel transistors, the plurality of first upper signal lines, the vertical vias and the first test line are disposed in a first substrate included in the pixel array; and the plurality of first lower signal lines is disposed in a second substrate located below the first substrate.

4. The image sensing device according to claim 1, wherein the pixel array further includes:

a plurality of second pixel transistors disposed in different rows from one another.

5. The image sensing device according to claim 1, wherein:

the pixel units further include an additional first pixel transistor located in a same row of the pixel array as one of the plurality of first pixel transistors, and one of the plurality of first upper signal lines is connected to the one of the plurality of first pixel transistors and the additional first pixel transistor.

6. The image sensing device according to claim 1, further comprising:

a plurality of first lower signal lines respectively connected to the plurality of first upper signal lines, wherein a first control signal for controlling a first pixel transistor is provided to a plurality of first pixel transistors located in an arbitrary row of the pixel array through an arbitrary first lower signal line and an arbitrary first upper signal line that is located in the arbitrary row of the pixel array and connected to an arbitrary first lower signal line.

7. The image sensing device according to claim 1, wherein:

the first test line is located below the at least one of the plurality of first upper signal lines, and is located in a same substrate as the at least one of the plurality of first upper signal lines.

8. The image sensing device according to claim 1, wherein the pixel array includes a first substrate and a second substrate that are disposed to overlap each other.

9. An image sensing device comprising, a pixel array including pixel units configured to generate photocharge in response to incident light, the pixel units including a plurality of first pixel transistors located in different rows of the pixel array;

a plurality of first upper signal lines respectively connected to the plurality of first pixel transistors;

a first test line, separated from and commonly connected to, the plurality of first upper signal lines;

a first test pad connected to the first test line and configured to provide a first test signal to the first test line; and a first test transistor connected to the first test line and the first test pad and configured to enable or disable a test operation by selectively providing the first test signal to the first test line, wherein during the test operation, the first test signal is provided to the plurality of first pixel transistors located in different rows of the pixel array through the first test transistor, the first test line, and the plurality of first upper signal lines, wherein the pixel array further includes:

a plurality of second upper signal lines respectively connected to a plurality of second pixel transistors;

a second test line separate from and commonly connected to, the plurality of second upper signal lines;

a second test pad connected to the second test line and configured to provide a second test signal to the second test line; and a second test transistor connected to the second test line and the second test pad.

10. The image sensing device according to claim 9, wherein:

the first test transistor and the second test transistor are activated at a same time.

11. The image sensing device according to claim 9, wherein:

the first test transistor and the second test transistor are activated at different times from each other.

12. The image sensing device according to claim 9, wherein:

each of the plurality of first pixel transistors is a reset transistor, a selection transistor, a transfer transistor, or a gain conversion transistor, each of the plurality of second pixel transistors is a reset transistor, a selection transistor, a transfer transistor, or a gain conversion transistor, and the each of the plurality of first pixel transistors is different from the each of the plurality of second pixel transistors.

13. An image sensing device, comprising:

a pixel array located in a first substrate layer and configured to receive incident light and generate photocharge in response to the incident light;

a plurality of first pixel transistors located in an arbitrary row included in the pixel array;

a first upper signal line connected to the plurality of first pixel transistors and located in the first substrate layer;

a first test line connected to the first upper signal line and located in the first substrate layer;

a first lower signal line connected to the first upper signal line and located in a second substrate layer below the first substrate layer; and a first test transistor connected to the first lower signal line and a first test pad, wherein the first test line, the first test transistor and the first test pad are provided to test the plurality of first pixel transistors, and wherein during a sensing operation, a first control signal for the first pixel transistor is provided to the plurality of first pixel transistors through the first lower signal line and the first upper signal line, and during a test operation, a first test signal provided through the first test pad is provided to the plurality of first pixel transistors without passing through the first lower signal line.

14. The image sensing device according to claim 13, further comprising:

an additional first pixel transistor located in a different row from the arbitrary row and connected to a different first upper signal line from the first upper signal line.

15. The image sensing device according to claim 14, wherein:

the different first upper signal line is connected to the first test line and the first test signal is provided to the additional first pixel transistor.

16. The image sensing device according to claim 14, wherein a second control signal different from the first control signal is provided to the additional first pixel transistor.

17. The image sensing device according to claim 13, wherein:

each of the plurality of first pixel transistors is a reset transistor, a selection transistor, a transfer transistor, or a gain conversion transistor.

18. The image sensing device according to claim 13, wherein:

the first test line is located below the first upper signal line, and is located in a same substrate as the first upper signal line.

19. The image sensing device according to claim 13, further comprising:

a second pixel transistor located in the arbitrary row and connected to a different first upper signal line from the first upper signal line.

20. The image sensing device according to claim 19, wherein a second test signal different from the first test signal is provided to the second pixel transistor.

* * * * *